Jan. 13, 1970 R. LANDRON 3,489,845

CERAMIC-GLASS HEADER FOR A SEMICONDUCTOR DEVICE

Original Filed Aug 5, 1966 3 Sheets-Sheet 1

INVENTOR
Rafael Landron

PRIOR ART Fig. 7a

CERAMIC-GLASS HEADER FOR A SEMICONDUCTOR DEVICE

Original Filed Aug 5, 1966

United States Patent Office 3,489,845

Patented Jan. 13, 1970

3,489,845

CERAMIC-GLASS HEADER FOR A SEMICONDUCTOR DEVICE

Rafael Landron, Richardson, Tex., assignor to Texas Instruments Incorporated, Dallas, Tex., a corporation of Delaware Continuation of application Ser. No. 570,468, Aug. 5, 1966. This application Dec. 4, 1968, Ser. No. 785,008

Int. Cl. H05k 5/06

U.S. Cl. 174—52 29 Claims

ABSTRACT OF THE DISCLOSURE

Disclosed is a ceramic-glass header using alternate layers of glass and ceramic and the method of making the header. The leads of the header extend through the ceramic and glass layers with the glass bonding to the leads and holding them in place. The glass also bonds the ceramic layers together, the ceramic layers defining the shape of the header. A semiconductor device is either mounted on one surface of a ceramic layer or to the leads themselves and when necessary the semiconductor device can be encapsulated.

This application is a continuation of my prior copending application Ser. No. 570,468, filed Aug. 5, 1966, now abandoned, which is in turn a continuation-in-part of my prior application Ser. No. 515,617 filed Dec. 22, 1965, also now abandoned.

This invention relates to headers for semiconductor devices and more particularly to composite glass and ceramic headers.

Mounting supports such as headers for semiconductor devices are, for the most part, constructed from metals and then coated with a layer of some metal, for example gold, to prevent contamination of the device. The fabrication of metal headers and the gold plating adds to the cost of these headers. Elimination of the metal parts removes the need for the plating of said parts, therefore reducing the overall cost of fabrication. There are various glass and ceramic materials available which are essentially inert and may be used, thereby eliminating the use of costly metals. Since ceramic and glass are essentially inert and do not affect the operation of the semiconductor device mounted thereon, they do not have to be gold plated.

It is therefore one object of the invention to provide a method of constructing a low-cost header.

Another object of the invention is the method of constructing a glass and ceramic header having a minimum number of metallic parts.

Still another object of the invention is a method of constructing a header for a semiconductor device in which layers of glass and ceramic are fused together to provide a mounting surface.

Still another object of the invention is to provide a header for semiconductor devices of glass and ceramic material of which the only metallic parts are the lead wires extending therethrough.

Still another object of the invention is to provide a semiconductor header having layers of glass and ceramic fused together and a metallic ring fused thereto to which an enclosure may be sealed.

Still another object of the invention is to provide a header with a recessed portion for mounting a semiconductor device thereby allowing plating of the device bonding area of the header while maintaining a low header profile.

A further object of the invention is to provide a lower cost integrated circuit header with greater hermeticity than conventional glass-to-metal seal headers.

Other objects and features of the invention will become more readily understood from the following detailed description and appended claims when considered in conjunction with the accompanying drawing in which like reference numerals designate like parts throughout the figures thereof, and in which:

Figure 6A:
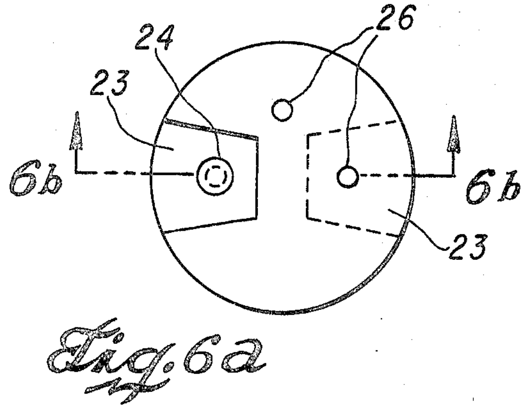
Figure 6B:
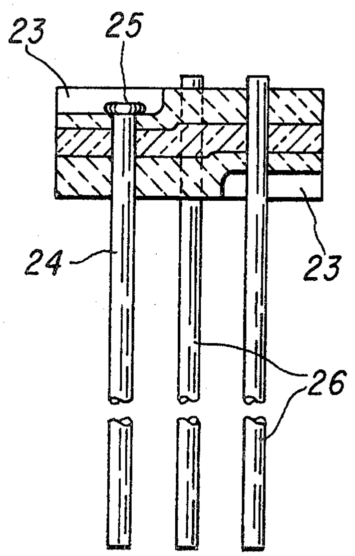
Figure 7B:
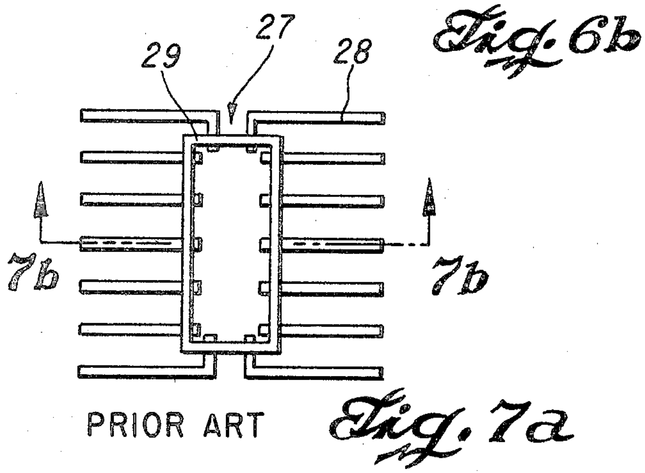
Fig. 7b PRIOR ART
Figure 7B:
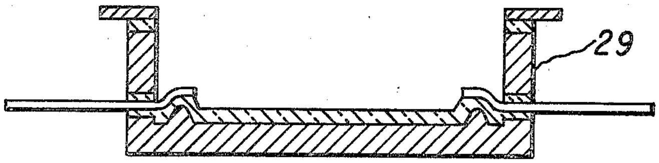
Fig. 7b PRIOR ART
Figures 8A, 8B, 8C, 8D:
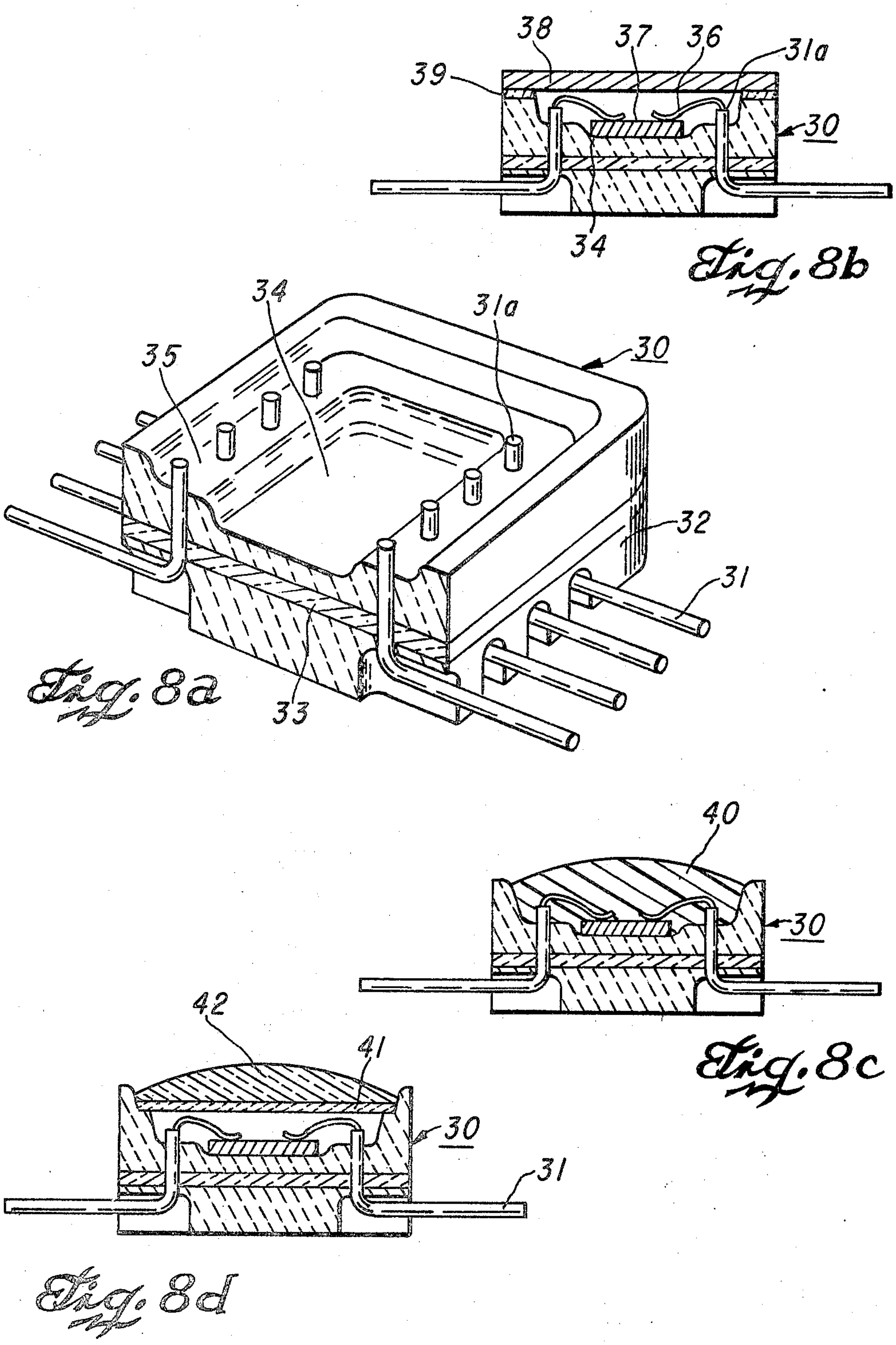

FIGURE 6*a* is a top view of a third embodiment of the invention showing a glass-ceramic header with recessed portions;

FIGURE 6*b* is a sectional view of the glass-ceramic header taken along the line 6*b*—6*b* of FIGURE 6*a*;

FIGURE 7*a* is a top view of a conventional prior art metal-glass integrated circuit header;

FIGURE 7*b* is a sectional view of the metal-glass integrated circuit header taken along the line 7*b*—7*b* of FIGURE 7*a*;

FIGURE 8*a* is a pictorial view, partly in section, of a fourth embodiment of the invention showing a glass-ceramic integrated circuit header;

FIGURES 8*b*–8*d* are sectional views of the glass-ceramic integrated circuit header illustrated in FIGURE 8*a* using different encapsulation techniques.

Figures 1, 2, 3:
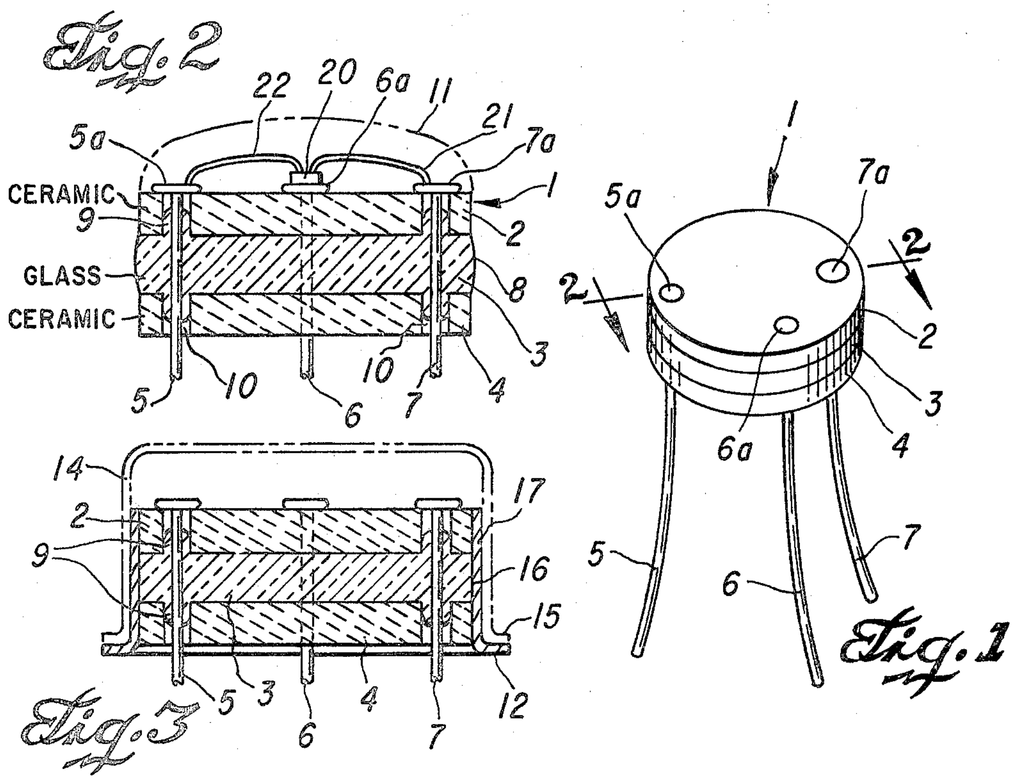
FIGURE 1 is a pictorial drawing of a glass-ceramic header of the invention with leads extending therefrom.
FIGURE 2 is a cross-section of the header in FIGURE 1 taken across section lines 2—2 with the addition of a semiconductor device mounted thereon and enclosed by an epoxy material represented by dashed lines.
FIGURE 3 is a second embodiment of the invention showing a metallic eyelet having a flange thereon and a can shown in dashed lines enclosing the top of said header.

Referring now to the drawings, there is shown in FIGURE 1 a composite header, generally indicated at 1 made of a layer of glass 3 interposed between and fused to two ceramic layers 2 and 4. Extending through and sealed to the glass and ceramic layers are the leads 5, 6, and 7. Each of the leads 5, 6 and 7 has a round, flat portion 5*a*, 6*a* and 7*a*, respectively, which is an integral part of the lead. These flat portions help hold the lead wires in place and provide mounting surfaces and/or connection points for any device mounted on the header.

FIGURE 2 is basically a section taken through section line 2—2 of FIGURE 1 showing the cross-section of the ceramic-glass wafer and the leads which extend through openings 10 in the composite wafer. In addition, a semiconductor device 20 is shown mounted on lead 6 and regions of the device connected to the lead wires 5 and 7 at 5*a* and 7*a*, respectively. To seal the device upon the top of the header, an epoxy material, represented by dotted line 11, may be coated over the semiconductor device and the wires connected thereto.

The center layer 3 of the composite header is an amorphous material such as glass which may be from one of the amorphous silicates, borates, phosphates or several other suitable materials, and the outer layers 2 and 4 are a ceramic material. In the process of making the header, the glass layer 3 flows into the openings 10 about the lead wires extending through the openings 10 and seals the lead wires within the openings. It should be noted that the glass in the hole 10 does not extend completely through the ceramic wafer. Therefore, a bending of the lead wires does not cause a cracking of the glass.

If it is desired that a metallic can be used to enclose the header, a metallic eyelet such as the eyelet 17 shown in FIGURE 3, may be placed around the composite header and fused thereto by the glass during the process of manufacturing as shown at 16. The header can 14 has a flange 15 which mates with the flange 12 of the metallic eyelet 17. These two flanges may be sealed together for example, by welding, thereby hermetically sealing the header. The header shown in FIGURES 2 and 3 results in a reduction of the metal surfaces to be gold plated, for example, in the header shown in FIGURE 2 only the top portions 5*a*, 6*a* and 7*a* of leads 5, 6 and 7 need be plated, resulting in a cost saving in the gold plating alone. A semiconductor device 20 is mounted on the top portion 6*a* with lead wires 22 and 21 connecting the device 20 to top portions 5*a* and 6*a*, respectively. Because of the size and location of the top surface (end) of the eyelet 17 of FIGURE 3, it is not necessary that it be plated which also results in a cost savings regarding gold plating of metal surfaces.

Figure 4:
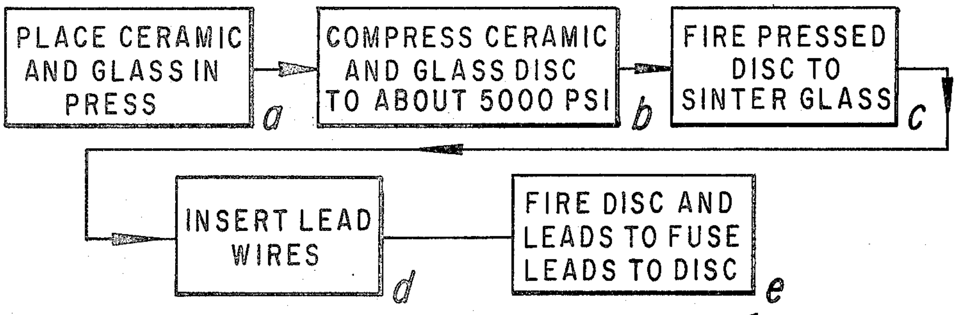
FIGURE 4 is a block flow diagram of the basic process for producing the header illustrated in FIGURE 1.

FIGURE 4 is a flow diagram of the basic steps to take in making the composite header. Block *a* of FIGURE 4 represents the placing of the ceramic and glass in a mold to be pressed. Block *b* specifies that the glass and ceramic is to be compressed at about 5000 p.s.i. to mold the glass and ceramic powders into a disc similar to that shown in FIGURE 5. The application of pressure to the glass and ceramic material compresses it so that it will hold together until it is sintered. In block *c* the pressed disc is sintered to fuse the glass and the glass-ceramic mixture together. After the disc has been sintered, lead wires are inserted into the holes 10. The disc with the lead wires therein are again fired (block *e*) to fuse the leads to the glass within the holes.

A more detailed description of the process used in making the glass and ceramic disc is as follows: Specific materials are used in the following example for purposes of explanation only. Other suitable materials as listed hereafter may be used and the invention is not limited to those specifically described below. First, a mixture of powdered glass and a temporary binder is made by mixing together 100 parts of powder glass approximately 280 mesh, 2 parts polyethylene glycol polymer and 15 parts water. A suitable glass is Corning 7052. In the event that the leads are to be made of a nickel-iron-cobalt alloy, such as for example, Kovar, sometimes referred to as F–15 alloy, it would be desirable for the glass to have a coefficient of expansion of about 40 to $50 \times 10^{-7}$ cm./cm./° C. The above mixture is thoroughly mixed and granulated by forcing it through a 28 mesh screen. Other methods for making granulations are also suitable, for example, using a spray dryer, hammer mills, etc. The granules are then dried in an oven at about 100° C. for about 30 minutes or until the material flows freely without clogging.

The preparation of the ceramic material is as follows: Mix 50 parts of the same type of glass powder used above with 50 parts of a refractory oxide such as aluminum oxide, zirconium oxide, or any other suitable refractory oxide. The two are mixed together, for example in a pebble mill, for about 30 minutes. The ceramic mixture is then granulated as was the glass and dried until it flows freely without clogging.

Figure 5:
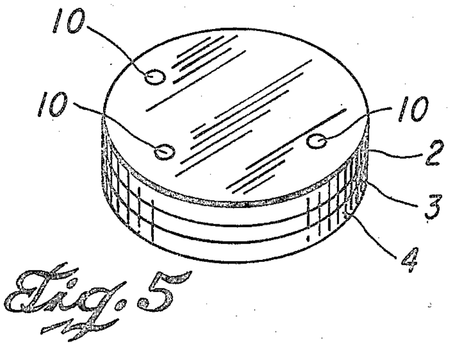
FIGURE 5 is a pictorial view of a glass-ceramic wafer produced by the process of the invention.

After the ceramic material and glass have been prepared portions of each material are placed in a press. A first layer of ceramic is covered with a layer of glass and then a second layer of ceramic is applied over the glass. The glass layer is made approximately twice as thick as the ceramic layer. The layered powder material is then subjected to a pressure between 500–20,000 pounds per square inch. The material is pressed into discs as illustrated in FIGURE 5. The holes 10 are formed in the disc by having pins of a suitable diameter within the die so that the powder is pressed about the pins. Any number of pins may be used to provide the number of holes desired within the disc.

After the material has been pressed, the temporary binder will hold the disc together so that it may be removed and handled without the powdery material crumbling apart. The pressed discs are then sintered in an air atmosphere to burn off the temporary binder material and fuse the glass particles together according to the following schedule:

5–20 minutes at 300° C.
5–20 minutes at 650° C.
5–20 minutes at 750° C.

The time of sintering is not critical and anywhere within the time range indicated, for example about 15 minutes will sufficiently sinter the glass and the glass within the ceramic mixture to hold the disc together. The sintering renders the glass impervious without losing its shape, and shrinkage will be only about 5%. Other mixtures will require a higher or lower firing temperature depending upon the softening point of the glass used. It should be noted that if other glasses or other refractory oxides are used, the proportions must be adjusted so that the ceramic layers have a softening point about 250° C. higher than the glass.

After sintering, lead wires are then inserted into the holes 10 and placed in a suitable jig made of graphite or equally suitable material. The jigs should have provisions for a small weight to provide about 1 pound per square inch of pressure to the top of the header to keep the wires down and exert some pressure between the layers. Caution should be taken since too much weight will force the glass out from between the ceramic layers at the sides of the disc. Only sufficient pressure is needed to keep the leads in place and to force a small amount of glass about the wires as illustrated at 9 in FIGURE 8. There may be a slight bowing of the side of the glass disc as indicated at 8 in FIGURE 2. After the lead wires have been inserted and the pressure applied, the discs and leads are fired in a neutral atmosphere at about 1000° C. for no less than 10 minutes and then cooled while still in the neutral atmosphere.

The process for making the flanged header as illustrated in FIGURE 3 is the same as making the headers illustrated in FIGURE 2 except that after the headers have been fired for the second time the top is removed from the graphite jigs and a metal eyelet is placed around the glass ceramic disc. After the metal eyelet has been placed around the disc the lid is put back on and the weight is placed on. However, this time the weight is approximately doubled, for example about 2 pounds per square inch over the top of the disc. The disc eyelet combination is then refired in the neutral atmosphere at the same temperatures and for the same time as before. By doubling the weight extra pressure is exerted on the glass layer between the two ceramic layers forcing the glass against tthe eyelet 17 as shown in FIGURE 3, to cause the glass to contact the eyelet at 16. The glass fuses to the eyelet thereby holding the eyelet in place and forming a hermetic seal therewith.

After the eyelet is attached to the disc, a semiconductor device may be mounted thereon in the same manner as that shown in FIGURE 2. Can 14, shown in FIGURE 3, is then placed over the header, and the flanges 12 and 15 attached together by any convenient method, for example by welding.

Table 1 is a listing of specific materials that may be used in the composite headers. Dumet is a copper clad F–15 alloy and Alloy #52 is a nickel-iron-chrome alloy. The Corning glass No. 7052 is a boro-silicate glass and the No. 9010 is a soda-lime glass.

To reduce the cost of the glass-ceramic header, the plated area of the leads is minimized by selectively plating only the portions of the leads that will be enclosed with the active device following encapsulation. However, due to the formation of bubbles on the surface of the ceramic during the plating process which prevents plating small metal areas nearer than .005" to the ceramic surface, the surface of the lead that will act as the bonding area for the semiconductor device must extend above the surface of the ceramic by at least .005". Standard mass production lead bonding techniques require that the ends of the lead wires must be higher than the .010" semiconductor wafer by at least .005" to prevent short circuiting the lead wires to the semiconductor wafer. Therefore, in conventional low profile packages the leads will extend to a greater height above the ceramic substrate than is desired.

In FIGURES 6*a* and 6*b* are illustrated a glass-ceramic header with recessed portions 23 on opposite faces and diametrically opposite each other. By the use of recessed portion to mount the semiconductor device, the total package height can be kept to a minimum. The opposed recessed portions allow automatic insertion of the leads for either surface of the glass-ceramic header can be utilized without surface orientation. The nailhead lead 24 is positioned in one of the recesses 23 which allows the attachment of the semiconductor wafer to the nailhead lead surface 25 within the recess 23 (semiconductor wafer not shown). The semiconductor wafer's top surface will be below the top surface of the leads 26.

When the standard metal-glass integrated circuit header 27, as illustrated in FIGURES 7*a* and 7*b*, is manufactured, the leads 28 must be accurately formed by stamping or etching a lead frame to enable the individual leads to be accurately aligned in the narrow openings of the metal case 29. Due to the accuracy required in forming the lead frame the leads 28 are very expensive. In addition, many headers are rejected due to shorting between leads 28 and the metal case 29 and loss of hermeticity of the leads' glass-to-metal seal.

Both of the above-mentioned reasons for the relative high cost of a metal-glass integrated circuit header are eliminated by use of the glass-ceramic header 30 as shown in FIGURE 8*a*. The expensive leads shown in FIGURE 7*a* are eliminated. Individual leads 31 can be used in a glass-ceramic header for the ceramic 32, an electrical insulator, positions the leads itself. The leads 31 can be loaded and positioned automatically at a further saving of cost over the hand positioned lead frame containing the leads 28 shown in FIGURE 7*a*. (Lead frame not shown.)

In the glass-ceramic header shown in FIGURE 8*a*, the leads 31 are round as opposed to the rectangular leads used in the conventional metal-glass integrated circuit leader (see FIGURE 7*a*). By being round the leads 31 can be purchased as standard size lead wire which reduces the cost of the leads. The leads 31 extend from the sides of the header 30 but extend vertically through the header 30 to utilize the glass layer 33 to form the glass-to-metal seal necessary for lead hermeticity. The leads **31*a* extend from the floor 34 of the header 30 to a sufficient height so that later wire connections from the leads 21*a*** can be made down to the top of the device (shown in FIGURES 8*b*, 8*c* and 8*d*) positioned on the floor 34 of the header 30. The header 30 is built up in the areas

35 where the leads **31*a* emerge within tthe header 30 for mechanical support of the leads 31*a***.

After the device is bonded to the floor 34 of the header 30 and the connecting wires 36 are bonded to the top of the leads **31*a* and the surface of the device 37, the header 30 can be enclosed by the use of a metal lid 38** as shown in FIGURE 8*b*. The metal lid may be fused to the header 30 by the use of a low temperature glass 39 which forms a hermetic seal.

In FIGURE 8*c* is illustrated a low cost package utilizing an epoxy or similar type plastic filler 40 to encapsulate the glass-ceramic header 30. Although the epoxy filled header 30 is not as hermetic as the package shown in FIGURE 8*b*, the epoxy 40 gives sufficient protection for most commercial apllications.

Another method of encapsulation using a low temperature sealing glass is shown in FIGURE 8*d*. A ceramic lid 41 is fused to the header 30 by the use of the glass 42. By the use of this method, the only conducting parts of the package are the active device itself and the leads 31 and finds application where high packing densities are involved with the inherent short circuiting problem.

In addition to the methods of encapsulation shown, a metal rim can be fused to the header by glassing or brazing to the header. A metal lid can then be either brazed or welded to the metal rim. The glass-ceramic header lends itself quite readily to all standard methods of encapsulation known in the art.

Although the invention has been described with respect to a specific preferred embodiment, it will be apparent that changes and modifications are possible without departing from the spirit and scope of the invention as defined in the appended claims.

TABLE 1

| Ceramic Layer | Glass Layer | Flange | Lead Wires | Sintering Temperature | Fusing Temperature | Approximate Coefficient of Expansion |
|---|---|---|---|---|---|---|
| 40% $Al_2O_3$, 60% No. 7052 | Corning 7052 | Kovar (F15 Alloy) | Kovar | 750° C. in Air | 1,000° C. in $N_2$ | $46\times10^{-7}$ cm./cm./° C. |
| 60% $SiO_2$, 40% 7052 | Corning 9010 | 1010 Steel | Dumet | 650° C. in Air | 900° C. in $N_2$ | $90\times10^{-7}$ cm./cm./° C. |

Typical Composition of Kovar Sealing Glasses:
- $SiO_2$=64%
- $B_2O_3$=20%
- $Al_2O_3$=7%
- BaO=3%
- $K_2O$=3%
- $Na_2O$=2%
- $Li_2O$=1%

Approximate Coefficient of Expansion=$46\times10^{-7}$ cm./cm./° C.

Typical Composition of Dumet or #52 Alloy Sealing Glass:

1. Soda-Lime Glass:
   - $SiO_2$=74%
   - $Na_2O$=16%
   - CaO=5%
   - MgO=4%
   - $Al_2O_3$=1%
2. Lead Glass:
   - $SiO_2$=64%
   - PbO=21%
   - $Na_2O$=8%
   - $K_2O$=6%
   - $Al_2O_3$=1%

Approximate Coefficient of Expansion=$90\times10^{-7}$ cm./cm./° C.

What is claimed is:

1. The method for making a composite semiconductor header comprising the steps of:

(a) placing alternate layers of a granulated glass and a granulated ceramic material into a mold, said mold having a plurality of pins to form a plurality of holes, (b) compressing said alternate layers of granulated materials to form a composite body having holes extending through said layers of glass and ceramic material, (c) heating said composite body to fuse the compressed glass granules to each other and to said ceramic granules, (d) inserting lead wires into said holes extending through said glass and said ceramic layers, and (e) heating said composite body and said lead wires to fuse said glass to said lead wires.

2. The method according to claim 1 wherein the material for the layers of granulated glass is obtained by mixing a glass powder with a temporary binder and granulating the mixture, and wherein the material for the layer of ceramic material is obtained by mixing a ceramic powder comprised of a glass powder mixed with a refractory oxide and granulating said mixture.

3. A method as defined in claim 1 including the additional step of:

(a) placing a metallic eyelet around said composite body prior to heating said composite body and said lead wires, and (b) fusing said glass layer to said metallic eyelet to bond said eyelet to said layer and form a hermetic seal therewith.

4. The method as defined in claim 1 wherein a metallic eyelet is placed around said composite body and fused to said glass layer after said heating of said composite body and said lead wires.

5. The method according to claim 1 wherein:

(a) said layer of said granulated glass is made by mixing a powdered glass with a binder material and water in the ratio of 100 parts glass to 2 parts binder material and 15 parts water; then said glass mixture is granulated to about 28 mesh;

(b) wherein said granulated ceramic material comprises 50 parts of powdered glass and 50 parts of refractory oxide and is granulated to about 28 mesh, wherein the mixture of said ceramic material and said powdered glass is placed in a mold, said mold having a plurality of pins to form a plurality of holes so that the first layer and last layer are said ceramic material;

(c) wherein said compressing of said alternate layers of materials is effected by applying pressure of between 500 and 5000 lbs. per square inch to form said material in a composite body having alternate layers of glass and ceramic material and having holes extending through the layers; and (d) wherein said heating of said composite body prior to lead wire insertion is accomplished by firing in an atmosphere for about 5 to 20 minutes at about 300° C., followed by about 5–20 minutes at about 650° C., and for about 5–20 minutes at about 750° C.

6. A composite header structure for semiconductor devices comprising in combination:

(a) a plurality of alternate layers of glass and ceramic material with the uppermost and lowermost layers being ceramic; and (b) a plurality of lead wires extending completely through said alternate layers; and wherein (c) said uppermost and lowermost ceramic layers each contain a recessed portion that is located diametrically opposite the other of said recessed portions; and wherein (d) at least one of said lead wires extends into one of said recessed portions; and wherein (e) said one lead wire has a nail-like head on one end that is positioned within said one recessed portion; and wherein (f) said one recessed portion is of sufficient depth so that when said semiconductor device is secured to the surface of said nail head, said device is within said one recessed portion below the plane of the outer surface of the respective ceramic layer.

7. A composite header structure for semiconductor devices comprising in combination:

(a) at least one layer of glass material positioned between two layers of ceramic material;

(b) at least one pair of co-axial openings respectively located in said ceramic layers; and (c) a nail-like lead wire having an elongated body portion that is narrower than said co-axial openings and a flat head portion that is wider than said co-axial openings; and wherein (d) said lead wire is positioned within said co-axial openings with its head overlying one of said co-axial openings and its body extending through said one opening, said glass layer and the other co-axial opening; and wherein (e) said glass layer has a pair of ear-like portions that respectively extend at least partially into said co-axial openings and around said body of said lead wire so as to seal said co-axial openings and firmly hold said lead wire in position.

8. The composite header structure of claim 7 and further including:

(a) a plurality of spaced pairs of co-axial openings respectively located in said ceramic layers; and (b) a plurality of nail-like lead wires respectively positioned within said co-axial openings; and wherein (c) said glass layer has a plurality of pairs of ear-like portions that respectively extend into said pairs of co-axial openings and around the body of said lead wires.

9. The composite header structure of claim 7 wherein a semiconductor device is secured to the head portion of said lead wire.

10. The composite header structure of claim 7 and further including a metallic eyelet that partially encloses said layers of glass and ceramic, said eyelet being secured in position by said glass layer.

11. The composite header structure of claim 10 wherein a semiconductor device is secured to the head portion of said lead wire and a cover is secured to said eyelet so as to hermetically seal said device within said structure.

12. A composite header structure for semiconductor devices comprising in combination:

(a) at least one layer of glass material positioned between first and second layers of ceramic material;

(b) at least one recessed portion formed in said first ceramic layer; and (c) at least one lead wire positioned within said one recessed portion and extending through said glass and ceramic layers; and wherein (d) said one lead wire has a head and body portions, with said head positioned within said one recessed portion and said body extending through said glass and ceramic layers; and wherein (e) said one recessed portion is of sufficient depth so that when a semiconductor device is connected to said head of said lead wire, said device is within said recessed portion below the plane of the outer surface of said first ceramic layer.

13. The composite header structure of claim 12 wherein a recessed portion is formed in both of said first and second ceramic layers, and a lead wire is positioned in each of said recessed portions, and the head of a selected one of said lead wires is positioned within its respective recessed portion.

14. The composite header structure of claim 13 wherein said recessed portions are located diametrically opposite each other.

15. The composite header structure of claim 13 wherein said head of said selected lead wire is flat with a diameter larger than said body of said lead wire.

16. The composite header structure of claim 15 wherein a semiconductor device is directly connected to said head of said lead wire and conductive wires thereof are selectively connected to the heads of the remaining lead wires.

17. The composite header structure of claim 12 wherein:

(a) a plurality of spaced recessed portions are formed in said second ceramic layer; and wherein (b) said one recessed portion of said first ceramic layer has a ledge zone and a floor zone; and wherein (c) a plurality of lead wires respectively extend through said spaced recessed portions and through said glass and ceramic layers with their heads terminating slightly above said ladge zone of said one recess portion; and wherein (d) a semiconductor device is directly connected to said floor zone of said one recess portion and conductive wires thereof are selectively connected to the heads of the remaining lead wires.

18. The composite header structure of claim 17 wherein each of said lead wires extends from said ledge zone through said glass and ceramic layers into its respective spaced recessed portion of said second ceramic layer, then each is bent so as to be in substantial parallelism with the outer surface of said second ceramic layer and with each other, and each of said lead wires terminates remote from said glass and ceramic layers.

19. The composite header structure of claim 17 and further including cover means hermetically sealing said semiconductor device within said one recessed portion.

20. The composite header structure of claim 19 wherein said cover means is a metal plate secured to the outer peripheral surface of said first ceramic layer.

21. The composite header structure of claim 19 wherein said cover means is plastic material that substantially fills said one recessed portion and encapsulates said semiconductor device.

22. The composite header structure of claim 19 wherein said cover means is a ceramic lid fused to the outer peripheral surface of said first ceramic layer.

23. The method of claim 1 wherein said holes in said composite body are wider than said lead wires so that when said composite body is heated to fuse said glass a portion of said glass enters said holes and surrounds said lead wires to seal said holes and hold said lead wires in position.

24. The method of claim 1 and further including the steps of:
(a) forming at least one recessed portion in each of the outermost layers of said composite body; and
(b) inserting at least one of said lead wires into one of said holes so that it terminates in one of said recessed portions of one of said outermost layers.

25. The method of claim 24 and further including the step of forming a nail-like head on the end of said one lead wire that terminates in said one recessed portion.

26. The method of claim 24 and further including the step of forming ledge and floor zones in said one recessed portion of said one outermost layer; and wherein
(a) a plurality of recessed portions are formed in the other outermost layer; and wherein
(b) a plurality of lead wires are respectively inserted through said plurality of recessed portions and holes so as to terminate within said one recessed portion slightly above said ledge zone.

27. The method of claim 26 and further including the steps of:
(a) securing a semiconductor device to said floor zone and selectively connecting conductor wires thereof to the ends of said lead wires; and
(b) securing a metal cover to the peripheral edge of said one outermost layer so as to hermetically seal said device within said composite body.

28. The method of claim 26 and further including the steps of:
(a) securing a semiconductor device to said floor zone and selectively connecting conductor wires thereof to the ends of said lead wires; and
(b) filling said one recessed portion with a plastic material so as to encapsulate said device within said composite body.

29. The method of claim 26 and further including the steps of:
(a) securing a semiconductor device to said floor zone and selectively connecting conductor wires thereof to the ends of said lead wires; and
(b) securing a ceramic lid to the peripheral edge of said one outermost layer so as to seal said device within said composite body.

References Cited

UNITED STATES PATENTS

| | | |
|---|---|---|
| 2,079,354 | 5/1937 | Knowles. |
| 2,206,515 | 7/1940 | Scharfnagel. |
| 2,804,581 | 8/1957 | Lichtgarn. |
| 3,295,005 | 12/1966 | Poellet et al. |

LARAMIE E. ASKIN, Primary Examiner

U.S. Cl. X.R.

65—18, 59; 174—152; 287—189, 365; 317—234